United States Patent
Ngo et al.

(10) Patent No.: US 6,897,144 B1
(45) Date of Patent: May 24, 2005

(54) CU CAPPING LAYER DEPOSITION WITH IMPROVED INTEGRATED CIRCUIT RELIABILITY

(75) Inventors: Minh Van Ngo, Fremont, CA (US); Paul Raymond Besser, Sunnyvale, CA (US); Larry Zhao, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 370 days.

(21) Appl. No.: 10/100,915

(22) Filed: Mar. 20, 2002

(51) Int. Cl.[7] .......................................... H01L 21/4763
(52) U.S. Cl. ...................... 438/627; 438/643; 438/653; 438/676; 438/680; 438/687
(58) Field of Search ........................ 438/584, 627–629, 438/643, 644, 653, 654, 676, 678, 680, 687

(56) References Cited

U.S. PATENT DOCUMENTS

| | | | | |
|---|---|---|---|---|
| 6,165,894 A | * | 12/2000 | Pramanick et al. | 438/627 |
| 6,339,025 B1 | * | 1/2002 | Lie et al. | 438/687 |
| 6,486,082 B1 | * | 11/2002 | Cho et al. | 438/789 |
| 2002/0155386 A1 | * | 10/2002 | Xu et al. | 430/312 |
| 2003/0129827 A1 | * | 7/2003 | Lee et al. | 438/629 |

FOREIGN PATENT DOCUMENTS

| | | | | |
|---|---|---|---|---|
| JP | 07106197 | * | 4/1995 | ............ H01G/4/33 |

OTHER PUBLICATIONS

Wolf and Tauber, "Silicon processing for the VLSI Era" vol. 1, p. 192, Lattice Press (1986).*

* cited by examiner

Primary Examiner—Asok Kumar Sarkar

(57) ABSTRACT

The electromigration resistance of nitride capped Cu lines is significantly improved by controlling the nitride deposition conditions to reduce the compressive stress of the deposited nitride layer, thereby reducing diffusion along the Cu-nitride interface. Embodiments include depositing a silicon nitride capping layer on inlaid Cu using dual frequency powers, holding the high frequency power constant and controlling the compressive stress of the deposited silicon nitride capping layer by varying the low frequency power to the susceptor, thereby enabling reduction of the compressive stress below about $2 \times 10^7$ Pascals. Embodiments also include sequentially and contiguously treating the exposed planarized surface of in-laid Cu with a soft plasma containing $NH_3$ diluted with $N_2$, and then depositing the silicon nitride capping layer by plasma enhanced chemical vapor deposition, while varying the low frequency power between about 100 to about 300 watts. Embodiments also include Cu dual damascene structures formed in dielectric material having a dielectric constant (k) less than about 3.9.

14 Claims, 2 Drawing Sheets

CU CAPPING LAYER DEPOSITION WITH IMPROVED INTEGRATED CIRCUIT RELIABILITY

TECHNICAL FIELD

The present invention relates to copper (Cu) and/or Cu alloy metallization in semiconductor devices, particularly to a method for forming reliably capped Cu or Cu alloy interconnects, such as single and dual damascene structures formed in low dielectric constant materials. The present invention is particularly applicable to manufacturing high speed integrated circuits having submicron design features and high conductivity interconnects with improved electromigration resistance.

BACKGROUND ART

The escalating requirements for high density and performance associated with ultra large scale integration semiconductor wiring require responsive changes in interconnection technology. Such escalating requirements have been found difficult to satisfy in terms of providing a low R×C (resistance×capacitance) interconnect pattern with electromigration resistance, particularly wherein submicron vias, contacts and trenches have high aspect ratios imposed by miniaturization.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to scratching or stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member.

As design rules extend deeper into the submicron range, the reliability of interconnect patterns becomes particularly critical. Therefore, the adhesion of capping layers to Cu interconnects and the accuracy of interconnects for vertical metallization levels require even greater reliability. In addition, as the design rules plunge deeper into the submicron regime, electromigration becomes increasingly problematic.

For example, in 0.13 micron Cu technology, vias typically exhibit a cross-sectional diameter about 0.15 to about 0.18 micron. Typical Cu damascene technology is schematically illustrated in FIG. 1 and comprises a lower Cu level, illustrated by lower metal line M1, a silicon nitride capping layer thereon, an upper metal line M2 with a silicon nitride capping layer thereon. M1 and M2 are connected by via V1. The via process typically involves a via etch through an oxide layer and a nitride layer, stopping on the underlying Cu M1. An argon (Ar) pre-sputter etch is employed prior to barrier layer and Cu deposition.

Upon further experimentation and investigation of electromigration failures attendant upon interconnect technology in the sub-micron regime, it was found that the two critical interfaces for electromigration in Cu or Cu alloy damascene are the V1-M1 and V1-M2 interfaces. Electromigration testing of the V1-M1 interface was conducted by flowing electrons from M2 through V1 into M1 lines. Electromigration testing of the V1-M2 interface was conducted by flowing electrons in the opposite direction. In the case of the V1-M1 interface, electromigration voids are typically generated at the Cu/nitride interface at the via, as shown in FIG. 2. In the case of the V1-M2 interface, electromigration voids are also generated at the Cu-nitride interface but away from the via, as schematically illustrated in FIG. 3.

Observations from such experimentation led to the conclusion that the electromigration voids are generated at the Cu-nitride interface in both cases. Diffusion can proceed along the Cu-nitride interface, the Cu-barrier layer interface or by a grain boundary mechanism. In the Cu damascene technology illustrated in FIGS. 1–3, the observations indicated that the diffusion along the Cu-nitride interface is the fastest diffusion path for electromigration failures.

Accordingly, there exists a continuing need for methodology enabling the formation of encapsulated Cu and Cu alloy interconnects for vertical metallization levels with greater accuracy, reliability and electromigration resistance. There exists a particular continuing need for methodology enabling the formation of capped Cu or Cu alloy lines, particularly in damascene structures, e.g., dual damascene structures formed in dielectric material having a low dielectric constant (k), with improved reliability and electromigration resistance along the Cu/capping layer interfaces.

DISCLOSURE OF THE INVETION

An advantage of the present invention is a method of manufacturing a semiconductor device having highly reliable capped Cu or Cu alloy interconnects.

Another advantage of the present invention is a method of manufacturing a semiconductor device comprising a silicon nitride capped Cu or Cu alloy interconnect member with improved electromigration resistance along the Cu or Cu alloy/silicon nitride capping layer interface.

A further advantage of the present invention is an apparatus for depositing a silicon nitride capping layer on a Cu or Cu alloy interconnect with an attendant improvement in electromigration resistance along the Cu or Cu alloy/silicon nitride capping layer interface.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: introducing a wafer containing inlaid copper (Cu) or a Cu alloy into a chamber, and, depositing a silicon nitride capping layer on the Cu or Cu alloy by plasma enhanced chemical vapor deposition (PECVD) while separately applying a high frequency power and a low frequency power to the chamber.

Another advantage of the present invention is an apparatus comprising: a chamber, a susceptor for mounting a wafer; means for introducing a low frequency power to the susceptor; and means for introducing a high frequency power to the chamber.

Embodiments of the present invention comprise a placing the wafer on a susceptor in a chamber, treating the surface of the wafer to remove oxide therefrom and then depositing the silicon nitride capping layer under controlled conditions, by varying the low frequency power connected to the susceptor, to increase the density and reduce the compressive stress of the deposited silicon nitride capping layer. Embodiments of the present invention include maintaining the high frequency power, applied above and spaced apart from the wafer, at a substantially constant value while varying the low frequency power between about 100 watts and about 300 watts to deposit the silicon nitride capping layer having a compressive stress below about $2 \times 10^7$ Pascals and a density of about 2.67 to about 2.77 $g/cm^2$.

Embodiments of the present invention further include single and dual damascene techniques comprising forming an opening in an interlayer dielectric on a wafer, depositing an underlying diffusion barrier layer, such as Ta and/or TaN, lining the opening and on the interdielectric layer, depositing a seedlayer, depositing the Cu or a Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the deposition chamber for processing in accordance with embodiments of the present invention by treating the exposed surface of the Cu or Cu alloy layer with a soft plasma employing a relatively low $NH_3$ flow rate and a relatively high $N_2$ flow rate, ramping up the introduction of $SiH_4$ and then depositing a silicon nitride capping layer on the treated surface employing the inventive technique comprising low and high frequency powers.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVTION

The present invention addresses and solves problems attendant upon forming capped Cu or Cu alloy interconnects, as with a capping layer of silicon nitride.

Methodology in accordance with embodiments of the present invention enables a significant improvement in the adhesion of a capping layer such as silicon nitride, to a Cu or Cu alloy interconnect member, thereby preventing capping layer peeling and preventing copper diffusion. In addition, embodiments of the present invention significantly reduce hillock formation, significantly improve electromigration resistance at the Cu/nitride interface, and significantly improve within wafer and wafer-to-wafer uniformity. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.13 micron and under, the electromigration resistance of encapsulated Cu interconnect members becomes increasingly significant. It was found that conventional practices in forming a Cu interconnect member in a damascene opening, e.g., a dual damascene opening, result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu and/or Cu alloy interconnect member. Consequently, cracks are generated at the Cu or Cu alloy/copper oxide interface, resulting in copper diffusion and increased electromigration as a result of such diffusion. The cracks occurring in the Cu or Cu alloy/copper oxide interface enhance surface diffusion, which is more rapid than grain boundary diffusion or lattice diffusion.

Figure 1:
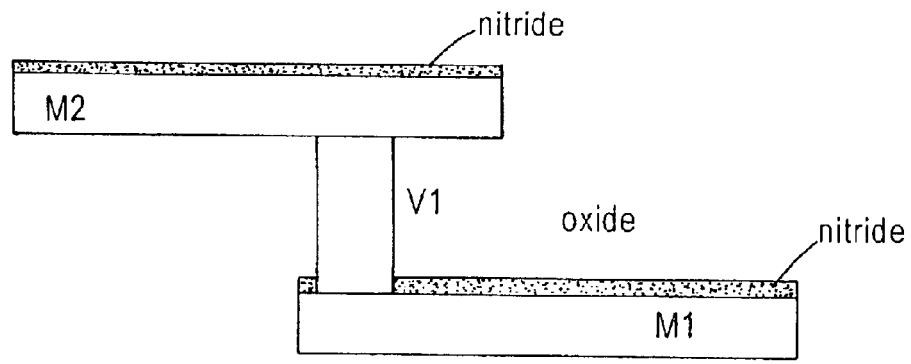
FIGS. 1 through 3 schematically illustrate a Cu damascene structure with electromigration voiding.
Figure 2:
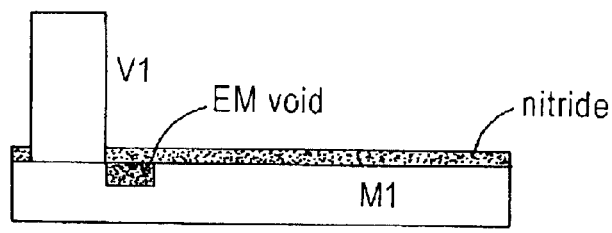
Figure 3:
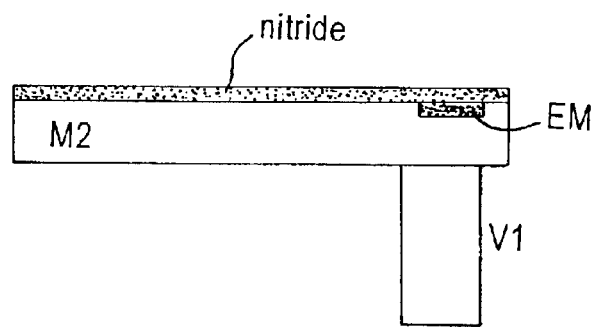

In application Ser. No. 09/902,587 filed on Jul. 21, 2001, now U.S. Pat. No. 6,429,128, issued on Aug. 6, 2002, a method is disclosed which addresses and solves the electromigration problem of capped Cu lines in Cu damascene structures, such as those illustrated in FIGS. 1–3, wherein voiding occurs at the Cu/capping layer interface. The disclosed method comprises controlling the nitride deposition conditions to reduce the compressive stress of the deposited nitride layer, thereby reducing diffusion along the Cu-nitride interface. The present invention stems from the realization that the compressive stress of the as deposited silicon nitride capping layer, as well as the density of the silicon nitride capping layer, can be controlled by applying dual-frequency powers comprising a high frequency power and a low frequency power. The low frequency power is applied to the susceptor on which the wafer is mounted. The density and compressive stress of the deposited silicon nitride capping layer can be controlled by controlling the low frequency power applied to the susceptor during deposition.

In accordance with embodiments of the present invention, the electromigration resistance of Cu lines is improved by reducing the diffusion path along the Cu/silicon nitride interface. Embodiments of the present invention comprise controlling the low frequency power applied to the susceptor such that the silicon nitride layer is deposited at a reduced compressive state, e.g., at a reduced compressive stress no greater than about $2 \times 10^7$ Pascals, and at a higher density. The reduction in stress reduces stress-enhanced diffusion along the Cu-nitride interface and improves electromigration reliability of the Cu damascene interconnect structure.

Figure 4:
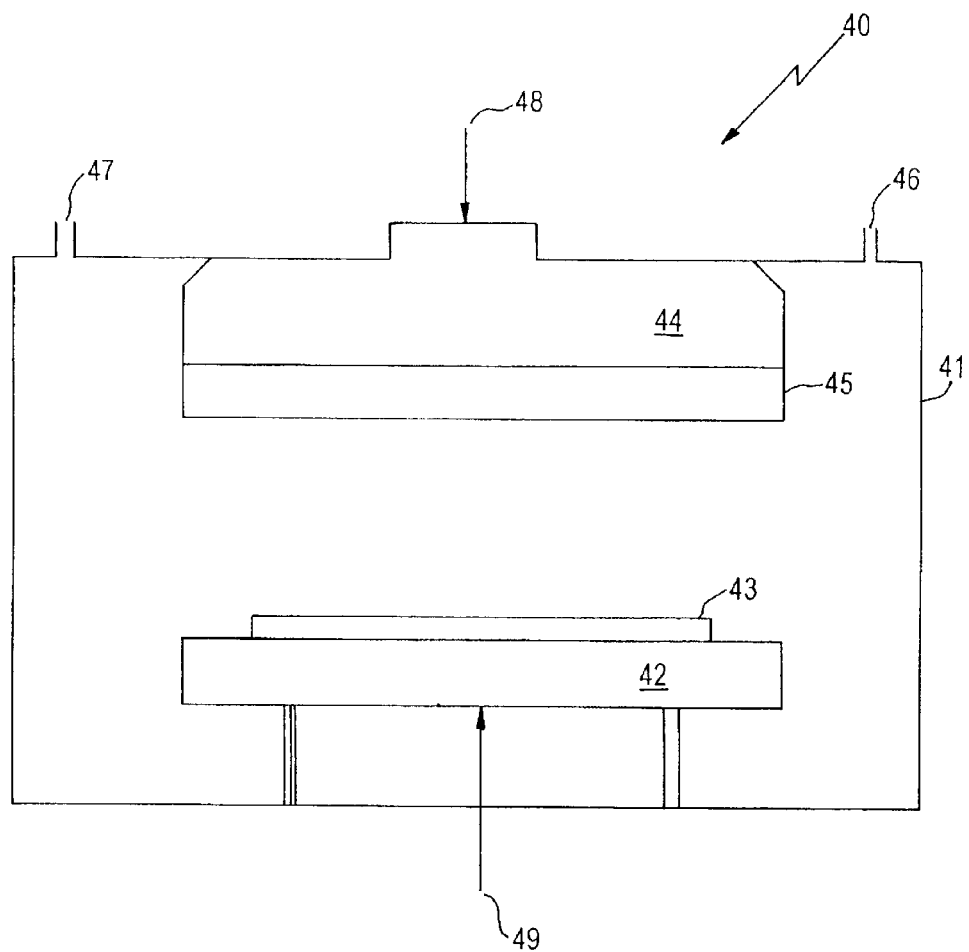
FIG. 4 schematically illustrates an apparatus in accordance with an embodiment of the present invention.

The objectives of the present invention can be achieved by providing an apparatus similar to a conventional apparatus such as an Applied Materials Producer™ PECVD device but modified in accordance with embodiments of the present invention by providing an additional low frequency power source coupled to a susceptor. An apparatus 40 in accordance with an embodiment of the present invention is schematically illustrated in FIG. 4 and comprises chamber 41 containing susceptor 42 on which a wafer 43 is mounted. Susceptor 42 is typically elevated to a temperature of about 300° C. to about 430° C., e.g., about 400° C., during deposition. Also positioned within chamber 41 are face plate 45 and blocker plate 44 which are conventional elements. Chamber 41 also comprises entry ports 46, 47 for introducing reactants, such as silane, ammonia and nitrogen. A high frequency power source is connected to the blocker plate, illustrated by electrical connection 48 and a low frequency power source is connected to the susceptor, as illustrated by electrical connection 49.

Embodiments of the present invention comprise maintaining the susceptor at a temperature of about 400° C. and maintaining the high frequency power at a substantially constant value, such as a value between 330 watts and 530 watts in order to optimize film properties, such as the refractive index, uniformity and stoichiometry. In accordance with the embodiments of the present invention, an additional low frequency power is applied to the susceptor and the compressive stress and density of the deposited silicon nitride capping layer tailored or controlled by varying the low frequency power. Embodiments of the present invention comprise varying the low frequency power between about 100 watts to about 300 watts, thereby enabling deposition of a silicon nitride capping layer having a compressive stress no greater than about 2×10 7 Pascals and a density of about 2.67 to about 2.77 $g/cm^3$.

Given the disclosed objectives and guidance of the present disclosure, optimum PECVD conditions can be determined in a particular situation. For example, suitable PECVD conditions include a $SiH_4$ flow rate of about 130 to about 330 sccm, e.g., about 230 sccm, an $NH_3$ flow rate of about 34 to about 54 sccm, e.g., about 44 sccm, a $N_2$ flow rate of about 4700 to about 6700 sccm, e.g., about 5700 sccm, a high frequency of RF power of about 300 to about 530 watts, e.g., about 430 watts, a spacing between the wafer and face plate of about 500 to about 700 mils, e.g., about 600 mils, a low frequency power of about 100 watts to about 300 watts, and a temperature of about 300° C. to about 430° C., e.g., about 400° C.

Embodiments of the present invention further include reducing an oxide film on the exposed surface of inlaid Cu prior to depositing the silicon nitride capping layer in accordance with the inventive method disclosed herein. Such pretreatments can include the use of a plasma containing $N_2$ and $NH_3$.

In accordance with embodiments of the present invention, a wafer containing in-laid Cu having an exposed surface with a copper oxide film believed to be generated by CMP is introduced into a deposition chamber. A $N_2$ flow rate of about 8,000 to about 9,200 sccm, e.g., 8,600 sccm, and an $NH_3$ flow rate of about 210 to about 310 sccm, e.g., about 260 sccm, is established. A pressure of about 3 to about 5 Torr and temperature of about 300° C. to about 400° C. are also established. A plasma is then initiated, as after about 10 to about 15 seconds, typically about 15 seconds, by applying an RF power of about 50 watts to about 200 watts, and the exposed surface of the in-laid Cu is treated with a soft $NH_3$ plasma to reduce the copper oxide film, typically for about 5 to about 40 seconds, e.g., about 5 to about 25 seconds.

The present invention addresses and solves the problem of surface contamination and surface reaction of inlaid Cu metallization after plasma treatment, as with an $NH_3$-containing plasma, thereby significantly improving the integrity of the interface between the Cu interconnect and capping layer, e.g., silicon nitride capping layer. Moreover, the present invention significantly reduces the formation of hillocks, thereby further reducing electromigration failures, and significantly improves within wafer and wafer-to-wafer uniformity. The present invention further reduces electromigration at the Cu/silicon nitride interface by providing methodology enabling a significant reduction in the compressive stress of the as deposited silicon nitride capping layer. Accordingly, the present invention enables a significant increase in device reliability, particularly in the submicron regime.

The mechanism underpinning the significant reduction in electromigration along the Cu/silicon nitride capping layer interface is not known with certainty. However, it is believed that by reducing the compressive stress of the as deposited silicon nitride layer, reducing copper oxide, and by improving the silicon-nitrogen bonding, the diffusion along the Cu/silicon nitride interface is significantly reduced along with void formation and electromigration failures. It is further believed that by applying and controlling the low frequency power the directionality of the ion bombardment during deposition is controlled and focused to reduce compressive stress and increase density. In addition, the soft plasma treatment employing a high $N_2$ flow rate and low $NH_3$ flow rate avoids sensitizing the clean Cu surface, thereby reducing its reactivity.

Silicon nitride capping layers deposited in accordance with the present invention typically have a thickness of about 450 Å to about 500 Å, and the resulting silicon nitride capped Cu interconnect exhibit significantly enhanced electromigration resistance vis-à-vis those produced by prior practices.

Improved electromigration resistance of capped Cu interconnects formed in accordance with embodiments of the present invetnion was confirmed by lognormal sigma measurements. Lognormal sigma is a measure of spread in electromigration (EM) data (failure times). Higher sigma leads to a lower projected EM lifetime at use conditions. The product EM lifetime is calculated by the following eqn: Lifetime=T50% exp(—N$^+$sigma) where T50% is Median time to fail (MTF) and N=6 for T0.1% failure rate and product factor of about $10^6$. Therefore, higher values of sigma could cause a significant degradation in projected lifetime due to the exponential dependence. The inventive process flow disclosed herein not only improves T50% but also give a tight sigma, which leads to higher projected DM lifetime.

Cu interconnects formed in accordance with embodiments of the present invention can be, but are not limited to, interconnects formed by damascene technology. Thus, embodiments of the present invention include forming an interlayer dielectric overlying a substrate, forming an opening, e.g., a damascene opening, in the interlayer dielectric, depositing a diffusion barrier layer, such as Ta and/or TaN, and filling the opening with Cu. Advantageously, the opening in the interlayer dielectric can be filled by initially depositing a seed layer and then electroplating or electrolessly plating the Cu. Typical seedlayers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed in accordance with an embodiment of the present invention, thereby substantially eliminating or significantly reducing surface contamination and surface reaction and, hence, significantly reducing electromigration failures.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron- and phosphorus doped silicate glass (BPSG), and silicon dioxide derived from tetraethylorthosilicate (FOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_X$™ (HSQ-based), XL™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamonde™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

Advantageously, the inventive apparatus and methodology enables a reduction in electromigration failures stemming from diffusion along the Cu/silicon nitride interface by enabling the deposition of a silicon nitride layer having a significantly reduced compressive stress and increased density. Such advantages are achieved in accordance with embodiments of the present invention by providing a PECVD chamber modified with a low frequency power source coupled to the susceptor and by controlling the low frequency power, thereby controlling ion bombardment during deposition and, hence, controlling the compressive stress and density of the deposited silicon nitride capping layer.

The present invention enables the formation of extremely reliable capped Cu and/or Cu alloy interconnect members by significantly reducing electromigration failures stemming from diffusion along the Cu/silicon nitride interface. In addition, the present invention enables a significant reduction in hillock formation and, hence, a significant increase in electromigration resistance. Consequently, the present invention advantageously reduces capping layer peeling, reduces copper diffusion, enhances electromigration resistance, improves device reliability, improves within wafer and wafer-to-wafer uniformity, increases production throughput and reduces manufacturing costs.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   introducing a wafer containing inlaid copper (Cu) or a Cu alloy into a chamber;
   depositing a silicon nitride capping layer on the Cu or Cu alloy by plasma enhanced chemical vapor deposition (PECVD) while separately applying a high frequency power and a low frequency power to the chamber; and
   controlling the compressive stress of the deposited silicon nitride layer by varying the low frequency power.

2. The method according to claim 1, comprising:
   placing the wafer on a susceptor in the chamber; and
   applying the low frequency power to the susceptor.

3. The method according to claim 2, comprising controlling the density of the deposited silicon nitride capping layer by varying the low frequency power.

4. The method according to claim 3, comprising controlling the density of the deposited silicon nitride capping layer between about 2.67 to about 2.77 g/cm$_3$.

5. The method according to claim 1, comprising controlling the compressive stress of the silicon nitride capping layer by varying the low frequency power between about 100 watts to about 300 watts.

6. The method according to claim 1, comprising:
   maintaining the high frequency power substantially constant; and
   varying the low frequency power to control ion bombardment during deposition to control the compressive stress of the deposited silicon nitride capping layer.

7. The method according to claim 1, comprising varying the low frequency power to control the compressive stress of the deposited silicon nitride capping layer below about $2 \times 10^7$ Pascals.

8. The method according to claim 6, comprising:
   placing the wafer on a susceptor in the chamber; and
   applying the low frequency power to the susceptor.

9. The method according to claim 8, comprising applying the high frequency power above and spaced apart from the wafer.

10. The method according to claim 6, comprising applying the high frequency power at a substantially constant value of about 330 to about 530 watts.

11. The method according to claim 1, comprising controlling the compressive stress of the deposited silicon nitride capping layer below about $2 \times 10^7$ Pascals.

12. The method according to claim 1, further comprising:
   treating an exposed surface of the Cu or Cu alloy to remove oxide therefrom; and depositing the silicon nitride capping layer on the treated surface.

13. The method according to claim 12, comprising the treating the exposed Cu or Cu alloys surface with a plasma containing ammonia and nitrogen to remove the oxide therefrom.

14. The method according to claim 1, wherein:
   the wafer contains a dual damascene structure comprising a Cu or Cu alloy line in contact with an underlying Cu or Cu alloy via formed in a dielectric layer; and
   the dielectric layer comprises a material having a dielectric constant less than about 3.9.

* * * * *